(12) United States Patent
Somasundaram

(10) Patent No.: US 7,162,572 B2
(45) Date of Patent: Jan. 9, 2007

(54) MEMORY AND POWER EFFICIENT MECHANISM FOR FAST TABLE LOOKUP

(75) Inventor: Madian Somasundaram, Los Altos Hills, CA (US)

(73) Assignee: Spans Logic Inc., Mountain View, CA (US)

( * ) Notice: Subject to any disclaimer, the term of this patent is extended or adjusted under 35 U.S.C. 154(b) by 57 days.

(21) Appl. No.: 10/964,283

(22) Filed: Oct. 12, 2004

(65) Prior Publication Data

US 2005/0138279 A1 Jun. 23, 2005

Related U.S. Application Data

(60) Provisional application No. 60/510,761, filed on Oct. 11, 2003.

(51) Int. Cl.
*G06F 12/00* (2006.01)
(52) U.S. Cl. .......................... 711/108; 365/49
(58) Field of Classification Search ................ 711/108; 365/49
See application file for complete search history.

(56) References Cited

U.S. PATENT DOCUMENTS

| | | | |
|---|---|---|---|
| 6,266,262 B1 | 7/2001 | Washburn et al. | |
| 6,307,798 B1 | 10/2001 | Ahmed et al. | |
| 6,331,961 B1 | 12/2001 | Kengeri et al. | |
| 6,560,610 B1 | 5/2003 | Eatherton et al. | |
| 6,757,779 B1 * | 6/2004 | Nataraj et al. | 711/108 |
| 6,831,850 B1 * | 12/2004 | Pereira et al. | 365/49 |
| 6,944,709 B1 * | 9/2005 | Nataraj et al. | 711/108 |
| 2002/0161969 A1 * | 10/2002 | Nataraj et al. | 711/108 |

OTHER PUBLICATIONS

Baboescu, Florin and Varghese, George, Scalable Packet Classification, UC San Diego, SIGCOMM'01, Aug. 27-31, 2001.
CAMs In Packet Classification: Can Fully Algorithmic Solutions Still Complete?, Netronics, Jul./Aug. 2001.
commsdesign web pages [online]. CommsDesign.com [retrieved on Feb. 2, 2004]. Retrieved fron the Internet: <URL: http://www.commsdesign.com/printableArticle/;jsessionid=0WZT1VRSWGMPGQSNDBC...>, 1 page.
commsdesign web pages [online]. CommsDesign.com [retrieved on Jun. 23, 2003] Retrieved from the Internet: <URL: http://www.commsdesign.com/design_comer/OEG20030619S0013>, 7 pages.
Gupta, Pankaj et al., Routing Lookups in Hardware at Memory Access Speeds, Stanford University.
Gupta, Pankaj and McKeown, Nick, Packet Classification on Multiple Fields, Stanford University.
Ichiriu, Mike, NetLogic Microsystems™ White Paper: High Performance Layer 3 Forwarding, 2000, pp. 1-6, NetLogic Microsystems, Inc.
MOSAID The Next Generation of Content Addressable Memories, Sep. 1999, MOSAID Technologies Incorporated.
Welfeld, Feliks, Packet Classification Processor: The Ultimate Branching Machine, CTO, Solidum, 2001.
UTCAM-Engine Technical Summary, UTC Microelectronic Systems, Sep. 2000.

* cited by examiner

*Primary Examiner*—Brian R. Peugh
(74) *Attorney, Agent, or Firm*—Fenwick & West LLP

(57) ABSTRACT

A method of implementing classification CAM functionality using primarily RAM cells is disclosed.

1 Claim, 23 Drawing Sheets

| Entry# | Bit0 | Bit1 | Bit2 | Bit3 | Bit4 | Bit5 | Bit6 | Bit7 | Bit8 | Bit9 | Bit10 | Bit11 | Bit12 |
|---|---|---|---|---|---|---|---|---|---|---|---|---|---|
| 1 | 0 | 1 | 0 | x | x | 1 | 0 | x | x | x | 0 | 1 | 0 |
| 2 | 0 | 1 | 0 | 1 | 1 | 1 | x | x | x | x | x | x | 1 |
| 3 | 1 | 1 | x | x | x | 1 | 1 | 1 | 1 | 0 | 0 | 0 | 1 |
| 4 | x | x | x | x | x | 0 | 1 | 0 | 0 | 0 | 1 | 0 | x |
| 5 | x | x | x | x | x | 0 | 0 | 0 | 0 | 1 | x | 0 | x |
| 6 | 1 | x | x | x | x | 1 | 1 | 1 | x | x | 1 | 1 | 0 |
| 7 | 0 | 1 | 0 | 1 | 0 | x | x | x | x | x | 0 | x | x |
| 8 | 1 | x | x | x | x | 0 | 0 | 1 | 0 | x | 1 | x | x |
| 9 | 1 | x | x | x | x | x | x | x | x | x | 1 | 0 | x |
| 10 | 1 | 1 | 1 | x | x | x | x | x | x | x | 0 | 0 | 1 |
| 11 | x | x | x | x | x | x | x | x | x | x | 0 | 0 | x |
| 12 | x | x | x | x | x | 0 | 0 | x | x | x | 1 | 1 | 0 |
| 13 | 0 | 1 | 0 | 1 | 1 | 0 | 0 | 0 | 0 | x | 0 | x | x |
| 14 | 1 | 1 | x | x | x | 1 | x | x | x | x | x | 0 | 0 |
| 15 | 0 | 1 | 1 | 0 | 1 | 0 | 1 | x | x | x | x | 1 | 1 |
| 16 | 0 | x | x | x | x | 1 | 0 | 0 | x | x | 0 | 1 | 1 |
| 17 | x | x | x | x | x | 0 | 1 | 0 | 1 | x | 0 | x | x |
| 18 | 0 | x | x | x | x | 0 | 1 | 0 | 0 | x | 0 | 0 | x |
| 19 | 0 | x | x | x | x | 1 | x | x | x | x | x | x | 0 |
| 20 | 1 | x | x | x | x | 0 | 0 | 0 | 0 | x | 0 | 1 | x |

FIG. 4

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 1 | 0 | 1 | 0 | x | x | 1 | 0 | x | x | x | 0 | 1 | 0 | 0 | 1 | 0 | 0 |
| 2 | 0 | 1 | 0 | 1 | 1 | 1 | x | x | x | x | x | x | 1 | 0 | 1 | x | 1 |
| 3 | 1 | 1 | x | x | x | 1 | 1 | 1 | 1 | 0 | 0 | 0 | 1 | 1 | 1 | 1 | 1 |
| 4 | x | x | x | x | x | 0 | 1 | 0 | 0 | 0 | 1 | 0 | x | x | 0 | 1 | x |
| 5 | x | x | x | x | x | 0 | 0 | 0 | 0 | 1 | x | 0 | x | x | 0 | 0 | x |

Grp1

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 6 | 1 | x | x | x | x | 1 | 1 | 1 | x | x | 1 | 1 | 0 | 1 | x | 1 | 1 |
| 7 | 0 | 1 | 0 | 1 | 0 | x | x | x | x | x | 0 | x | x | 0 | 0 | x | x |
| 8 | 1 | x | x | x | x | 0 | 0 | 1 | 0 | x | 1 | x | x | 1 | x | 0 | x |
| 13 | 0 | 1 | 0 | 1 | 1 | 0 | 0 | 0 | 0 | x | 0 | x | x | 0 | 1 | 0 | x |
| 14 | 1 | 1 | x | x | x | 1 | x | x | x | x | x | 0 | 0 | 1 | x | 1 | 0 |

Grp2

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 9 | 1 | x | x | x | x | x | x | x | x | x | 1 | 0 | x | x | 1 | 0 | x |
| 10 | 1 | 1 | 1 | x | x | x | x | x | x | x | 0 | 0 | 1 | x | 0 | 0 | 1 |
| 12 | x | x | x | x | x | 0 | 0 | x | x | x | 1 | 1 | 0 | 0 | 1 | 1 | 0 |
| 15 | 0 | 1 | 1 | 0 | 1 | 0 | 1 | x | x | x | x | 1 | 1 | 1 | x | 1 | 1 |
| 16 | 0 | x | x | x | x | 1 | 0 | 0 | x | x | x | 1 | 1 | 0 | 0 | 1 | 1 |

Grp3

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 11 | x | x | x | x | x | x | x | x | x | x | 0 | 0 | x | 0 | | | |
| 20 | 1 | x | x | x | x | 0 | 0 | 0 | 0 | x | 0 | 1 | x | 1 | | | |

Grp4

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 17 | x | x | x | x | x | 0 | 1 | 0 | 1 | x | 0 | x | x | 1 | | | |
| 18 | 0 | x | x | x | x | 0 | 1 | 0 | 0 | x | 0 | 0 | x | 0 | | | |

Grp5

| Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|
| 19 | 0 | x | x | x | x | 1 | x | x | x | x | x | x | 0 | | | | |

Grp6

FIG. 5

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp1 | 1 | 0 | 1 | 0 | x | x | 1 | 0 | x | x | x | 0 | 1 | 0 | 0 | 0 | 0 | |
| | 3 | 1 | 1 | x | x | x | 1 | 1 | 1 | 1 | 0 | 0 | 0 | 1 | 1 | 0 | 1 | |
| | 6 | 1 | x | x | x | x | 1 | 1 | 1 | x | x | 1 | 1 | 0 | 1 | 1 | 0 | |
| | 12 | x | x | x | x | x | 0 | 0 | x | x | x | 1 | 1 | 0 | 0 | 1 | 0 | |
| | 16 | 0 | x | x | x | x | 1 | 0 | 0 | x | x | 0 | 1 | 1 | 0 | 0 | 1 | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp2 | 10 | 1 | 1 | 1 | x | x | x | x | x | x | x | 0 | 0 | 1 | | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp3 | 4 | x | x | x | x | x | 0 | 1 | 0 | 0 | 0 | 1 | 0 | x | 1 | 0 | | |
| | 11 | x | x | x | x | x | x | x | x | x | x | 0 | 0 | x | 0 | 0 | | |
| | 20 | 1 | x | x | x | x | 0 | 0 | 0 | 0 | x | 0 | 1 | x | 0 | 1 | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp4 | 9 | 1 | x | x | x | x | x | x | x | x | x | 1 | 0 | x | 1 | | | |
| | 18 | 0 | x | x | x | x | 0 | 1 | 0 | 0 | x | 0 | 0 | x | 0 | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp5 | 17 | x | x | x | x | x | 0 | 1 | 0 | 1 | x | 0 | x | x | 1 | | | |
| | 8 | 1 | x | x | x | x | 0 | 0 | 1 | 0 | x | 1 | x | x | 0 | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp6 | 7 | 0 | 1 | 0 | 1 | 0 | x | x | x | x | x | 0 | x | x | 0 | | | |
| | 13 | 0 | 1 | 0 | 1 | 1 | 0 | 0 | 0 | 0 | x | 0 | x | x | 1 | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp7 | 14 | 1 | 1 | x | x | x | 1 | x | x | x | x | x | 0 | 0 | 0 | | | |
| | 15 | 0 | 1 | 1 | 0 | 1 | 0 | 1 | x | x | x | x | 1 | 1 | 1 | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp8 | 5 | x | x | x | x | x | 0 | 0 | 0 | 0 | 1 | x | 0 | x | | | | |

| | Entry# | Bt0 | Bt1 | Bt2 | Bt3 | Bt4 | Bt5 | Bt6 | Bt7 | Bt8 | Bt9 | Bt10 | Bt11 | Bt12 | SB0 | SB1 | SB2 | SB3 |
|---|---|---|---|---|---|---|---|---|---|---|---|---|---|---|---|---|---|---|
| Grp9 | 2 | 0 | 1 | 0 | 1 | 1 | 1 | x | x | x | x | x | x | 1 | 1 | | | |
| | 19 | 0 | x | x | x | x | 1 | x | x | x | x | x | x | 0 | 0 | | | |

FIG. 8

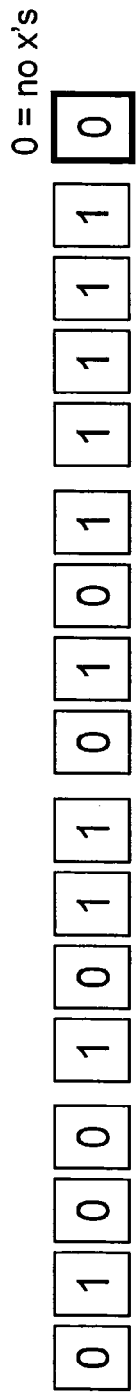
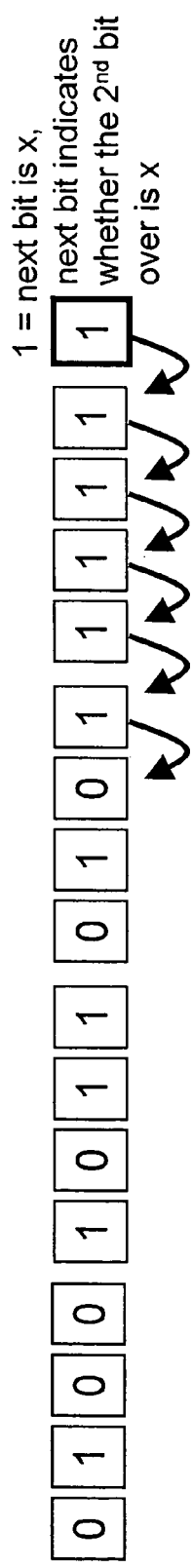
FIG. 9

| SB0 | SB1 | SB2 | SB3 | SB4 | SB5 | SB6 | SB7 | Entry # |
|---|---|---|---|---|---|---|---|---|
| 0 | 0 | 1 | 0 | 0 | 1 | 1 | 1 | 1 |
| 1 | 0 | 0 | 1 | 0 | 1 | 0 | 0 | 2 |
| 1 | 1 | 0 | 0 | 0 | 1 | 1 | 1 | 3 |
| 1 | 0 | 0 | 1 | 0 | 0 | 1 | 1 | 4 |
| 1 | 0 | 0 | 0 | 0 | 1 | 1 | 1 | 5 |
| 0 | 0 | 0 | 1 | 1 | 1 | 1 | 1 | 6 |
| 0 | 1 | 1 | 1 | 0 | 1 | 0 | 0 | 7 |
| 0 | 1 | 0 | 0 | 1 | 0 | 0 | 1 | 8 |
| 1 | 1 | 0 | 0 | 1 | 0 | 1 | 0 | 9 |
| 0 | 0 | 1 | 1 | 0 | 1 | 0 | 0 | 10 |
| 0 | 0 | 0 | 1 | 0 | 1 | 0 | 0 | 11 |
| 1 | 1 | 1 | 0 | 1 | 1 | 0 | 0 | 12 |
| 1 | 1 | 0 | 1 | 0 | 1 | 1 | 1 | 13 |
| 0 | 1 | 0 | 1 | 0 | 0 | 0 | 0 | 14 |
| 1 | 1 | 0 | 1 | 0 | 0 | 1 | 1 | 15 |
| 1 | 0 | 0 | 0 | 1 | 1 | 0 | 0 | 16 |

FIG. 11

| SB0 | SB1 | SB2 | SB3 | SB4 | SB5 | SB6 | SB7 | Entry # |
|---|---|---|---|---|---|---|---|---|
| 0 | 0 | 1 | 0 | 0 | 1 | 1 | 1 | 1 |
| 0 | 0 | 0 | 1 | 1 | 1 | 1 | 1 | 6 |
| 0 | 0 | 1 | 1 | 0 | 1 | 0 | 0 | 10 |
| 0 | 0 | 0 | 1 | 0 | 1 | 0 | 0 | 11 |
| 1 | 0 | 0 | 0 | 0 | 1 | 1 | 1 | 5 |
| 0 | 1 | 1 | 1 | 0 | 1 | 0 | 0 | 7 |
| 0 | 1 | 0 | 0 | 1 | 0 | 0 | 1 | 8 |
| 0 | 1 | 0 | 1 | 0 | 0 | 0 | 0 | 14 |
| 1 | 0 | 0 | 1 | 0 | 1 | 0 | 0 | 2 |
| 1 | 1 | 0 | 0 | 0 | 1 | 1 | 1 | 3 |
| 1 | 0 | 0 | 1 | 0 | 0 | 1 | 1 | 4 |
| 1 | 0 | 0 | 0 | 1 | 1 | 0 | 0 | 16 |
| 1 | 1 | 0 | 0 | 1 | 0 | 1 | 0 | 9 |
| 1 | 1 | 1 | 0 | 1 | 1 | 0 | 0 | 12 |
| 1 | 1 | 0 | 1 | 0 | 1 | 1 | 1 | 13 |
| 1 | 1 | 0 | 1 | 0 | 0 | 1 | 1 | 15 | less than or equal to 00110100 greater than 00110100 and less than or equal to 10000111 greater than 10000111 and less than or equal to 11000111 greater than 11000111

FIG. 12

|  | | Bit1 | Bit2 | Bit3 | Bit4 | Bit5 | Bit6 | Bit7 | Bit8 |
|---|---|---|---|---|---|---|---|---|---|
| Input | | 1 | 0 | 0 | 1 | 0 | 1 | 1 | 0 |
| Select Register | | 0 | 0 | 1 | 0 | 0 | 1 | 0 | 1 |
| Step 0 (immediately after load) | Full/Empty | E | E | F | E | E | F | E | F |
|  | Value | - | - | 0 | - | - | 1 | - | 0 |
| Step 1 | Full/Empty | E | F | E | E | F | E | F | E |
|  | Value | - | 0 | - | - | 1 | - | 0 | - |
| Step 2 | Full/Empty | F | E | E | F | E | F | E | E |
|  | Value | 0 | - | - | 1 | - | 0 | - | - |
| Step 3 | Full/Empty | F | E | F | E | F | E | E | E |
|  | Value | 0 | - | 1 | - | 0 | - | - | - |
| Step 4 | Full/Empty | F | F | E | F | E | E | E | E |
|  | Value | 0 | 1 | - | 0 | - | - | - | - |
| Step 5 | Full/Empty | F | F | F | E | E | E | E | E |
|  | Value | 0 | 1 | 0 | - | - | - | - | - |
| Output | | 0 | 1 | 0 | | | | | |

FIG. 16

|  | | | Bit1 | Bit2 | Bit3 | Bit4 |
|---|---|---|---|---|---|---|
| Input | | | 1 | 0 | 0 | 1 |
| Select Register | | | 0 | 0 | 1 | 0 |
| Position Bits | | | 1 | 0 | 0 | 0 |
|  | | | Bit5 | Bit6 | Bit7 | Bit8 |
| Input | | | 0 | 1 | 1 | 0 |
| Select Register | | | 0 | 1 | 0 | 1 |
| Position Bits | | | 0 | 1 | 1 | 0 |
| Step0 | Full/Empty Value | Bits 1-4 | E - | E - | F 0 | E - |
|  | Full/Empty Value | Bits 5-8 | E - | F 1 | E - | F 0 |
| Step1 | Full/Empty Value | Bits 1-4 | E - | F 0 | E - | E - |
|  | Full/Empty Value | Bits 5-8 | E - | F 1 | F 0 | E - |
| Step2 | Full/Empty Value | Bits 1-4 | F 0 | E - | E - | E - |
|  | Full/Empty Value | Bits 5-8 | E - | F 1 | F 0 | E - |
| Output | | | | 0 | 1 | 0 |

FIG. 18

| IP Source Address | IP Destination Address | IP Protocol | TCP Source Port | TCP Destination Port |
|---|---|---|---|---|
| 32 bits | 32 bits | 8 bits | 16 bits | 16 bits |

FIG. 19

MEMORY AND POWER EFFICIENT MECHANISM FOR FAST TABLE LOOKUP

RELATED APPLICATION

This application is related to, claims priority to, and incorporates by reference in its entirety, U.S. provisional application Ser. No. 60/510,761 entitled "Memory And Power Efficient Content Addressable Memory for General Classification" that was filed on Oct. 11, 2003 by Madian Somasundaram.

BACKGROUND OF THE INVENTION

1. Field of the Invention

The present invention relates generally to Content Addressable Memories (CAM), also called associative memories.

2. Description of Background Art

A Content Addressable Memory (CAM) has a number of storage locations in which data can be stored. Once data is stored in a location, the location can be addressed using the content (data value) of the location. An input word is compared against a table of allowed values. If there is a match, the location of the matched word is returned. The location is typically used to address a related table and a corresponding word is returned. One application of CAMs is in internet protocol (IP) packet classification where IP addresses and other fields of an internet packet are compared in network switches and routers. In a common form of IP addresses, called a subnet address or an address prefix, definite values are specified for a certain number of bits and the rest of the bits of the address are specified as "x" (don't care) bits. An example for IPv4 addresses is given below:

0110 1100 0111 xxxx xxxx xxxx xxxx xxxx

The bits that are not x (don't care) form the prefix of the address, and the number of prefix bits is called prefix length. A subset of the classification application is to identify the matching prefix that has the longest number of prefix bits. In the more general classification application, several fields must match simultaneously. An example specification for classification is shown in the table of FIG. 19.

Additional fields may be used in the classification, for example 144 bits of specification can be used for Internet Protocol version four (IPv4) classification. In Internet Protocol version six (IPV6), the length of each address field is 128 bits long, and a classification specification can exceed 576 bits. A key characteristic of classification specifications is that each of the fields can have x (don't care) bits. Thus CAMs for classification must permit x (don't care) bits that are not necessarily contiguous. A class of CAMs called ternary CAMs has been introduced to address this need, where there is an extra bit associated with every data bit, called the mask bit.

There are many disadvantages with the conventional ternary CAM structure, however. Since each cell contains two memory cells, and a mask-and-compare circuit, implementation of a table of size $w \times 2^n$ requires $w \times 2^{n+1}$ memory elements, and $w \times 2^n$ mask-and-compare circuits. Since every lookup in the table requires the activation of all the cells, power consumption is proportional to $w \times 2^n$. For large values of n, the cost is considerable, and the power consumption is prohibitive. In addition, since the comparison logic is repeated in every cell, it is expensive and difficult to provide different kinds of comparison, and the typical CAM provides only bit-for-bit compares.

What is needed is a content addressable memory system that a) reduces the number of comparators required, b) uses arrays of pure memory, c) separates comparators from the memory elements, and d) selects specific entries as potential matches before comparing all bits. These changes will result in decreased implementation size, by reducing the number of memory elements and comparators, and a decrease in energy consumption, through a more efficient comparison of data entries.

SUMMARY OF THE INVENTION

A method is provided to implement content-addressable memories suitable for Internet packet classification that reduces the cost to a little more than one memory element per bit. The present invention makes possible significant power savings even with much larger CAM tables. The preferred embodiment provides a wide range of lookup functions within a single structure. The range of options can be exploited during the design stage (architectural scaling), during manufacture of chips (mask programmability), before the CAM is put into a particular use (field programmability), between cycles of CAM programming (re-programmability), or even between cycles of CAM usage (re-configurability). One embodiment of the present invention permits different kinds of comparison, including bit-for-bit and range compares. In other embodiments, different types of comparison can be mixed in the same CAM word or different CAM entries can be subject to different kinds of compares.

BRIEF DESCRIPTION OF THE DRAWINGS

FIG. 4 is an example table of CAM entries.

FIG. 5 shows an example of how CAM entries can be split into groups according to one embodiment of the present invention.

FIG. 8 illustrates how entries can be grouped so that x (don't care) values are not required in the Entry Selector according to one embodiment of the present invention.

FIG. 9 shows a coding scheme to represent prefix specifications according to one embodiment of the present invention.

FIG. 11 is an example Entry Selection Table according to one embodiment of the present invention.

FIG. 12 is an example of an Entry Selection Table that is split into four segments according to one embodiment of the present invention.

FIG. 16 shows the sequence of steps in selecting bits from an input according to one embodiment of the present invention.

FIG. 18 shows the sequence of steps in selecting bits with an overlapped bit select circuit according to one embodiment of the present invention.

FIG. 19 shows the format of an example classification specification according to one embodiment of the present invention.

DETAILED DESCRIPTION OF THE PREFERRED EMBODIMENTS

Embodiments of the present invention are now described with reference to the figures where like reference numbers indicate identical or functionally similar elements. Also in the figures, the left most digit(s) of each reference number correspond(s) to the figure in which the reference number is first used.

Figure 1:
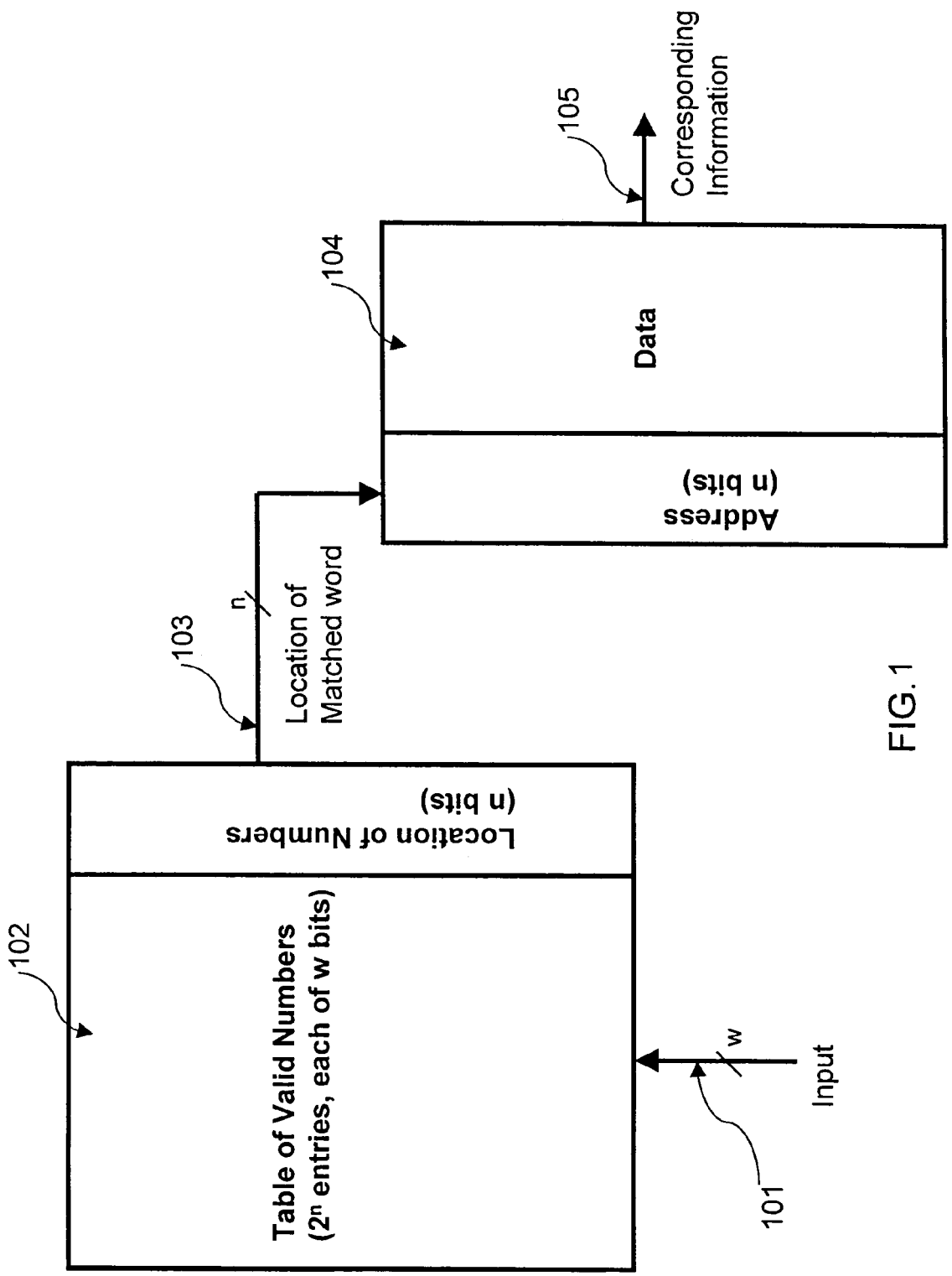
FIG. 1 shows a conventional CAM system.

FIG. 1 illustrates a typical system with a CAM. An input word of width w (101) is compared against a table of allowed values (102.) If there is a match, the location of the matched word (103) is returned. The location is typically used to address a related table (104) and a corresponding word (105) is returned.

Figure 2:
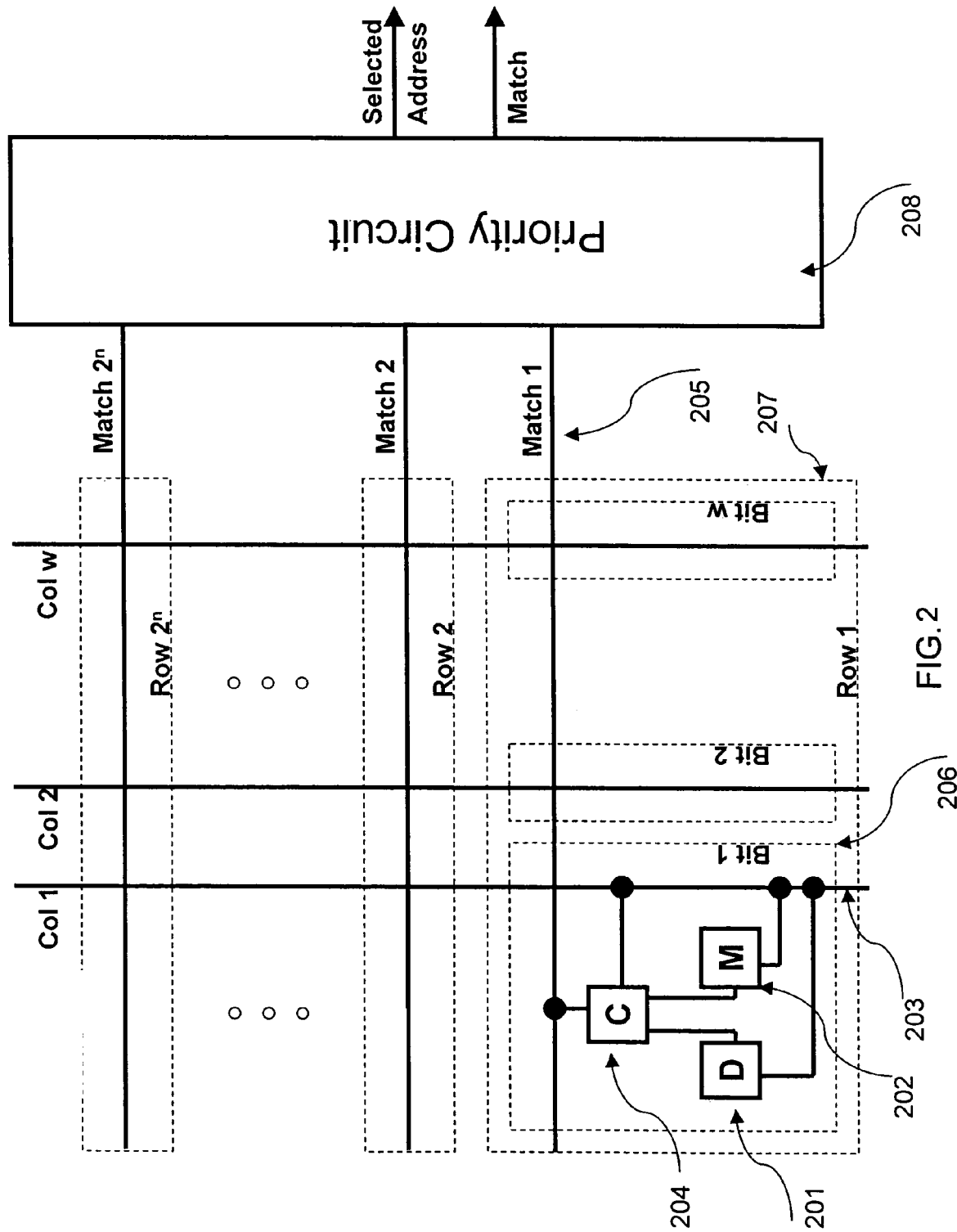
FIG. 2 shows a conventional ternary CAM array.

FIG. 2 shows a conventional ternary CAM array. The data is stored in the Data Register D (201) and the mask is stored in the Mask Register M (202). During a compare the value to be compared is placed on the column lines Col (203). The Compare circuit C (204) compares the data values to the Col line values, and transfers the result of the compare to the Match lines (205), if the value of the Mask Register indicates that the data bit is valid for comparison. The cell 206 is arrayed w times to form a row of width w (207), and the row is arrayed $2^n$ times to form the table. Since multiple rows may match a given input, a Priority Circuit (208) is used to select one of the match lines.

Figure 3A:
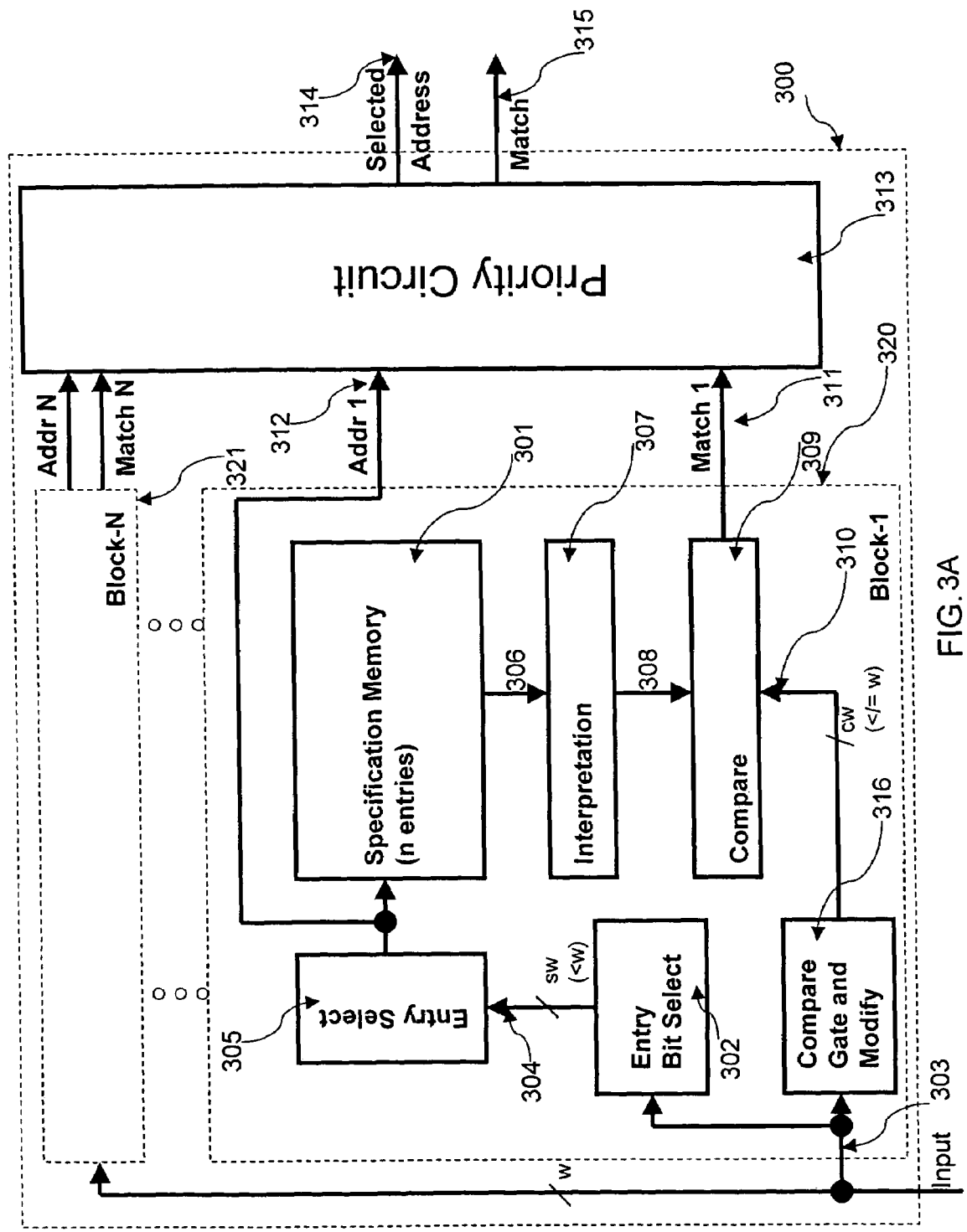
FIG. 3A is a block diagram of a CAM according to one embodiment of the present invention.

The block diagram of FIG. 3A illustrates a CAM (300) with a capacity of N×n entries, according to one embodiment of the present invention. There are N blocks, Block-1 (320) through Block-N (321.) Within each block there is a Specification Memory 301 which can store up to n entries. The Entry Bit Select circuit 302 selects certain bits from the input word 303 of width w. The Entry Select circuit 305 uses the selected bits 304, of width sw, to select one of the n entries from the Specification Memory. The selected entry, output on 306, is optionally modified by the Interpretation circuit 307 and output on 308. The input 303 is optionally modified by the Compare Gate and Modify circuit 316 and output on 310. The Compare circuit 309 compares 308 against 310, and indicates whether the input matched the selected entry on Match line 311. The address of the selected entry within the block is output as Addr 312. There are N match indicators, one from each of the N blocks, one of which is selected by the Priority Circuit 313, whose output Match 315 is set if at least one of the blocks indicates a match. The output Selected Address 314 combines the identity of the group selected by the Priority Circuit and the address of the matching entry within that block.

Figure 3B:
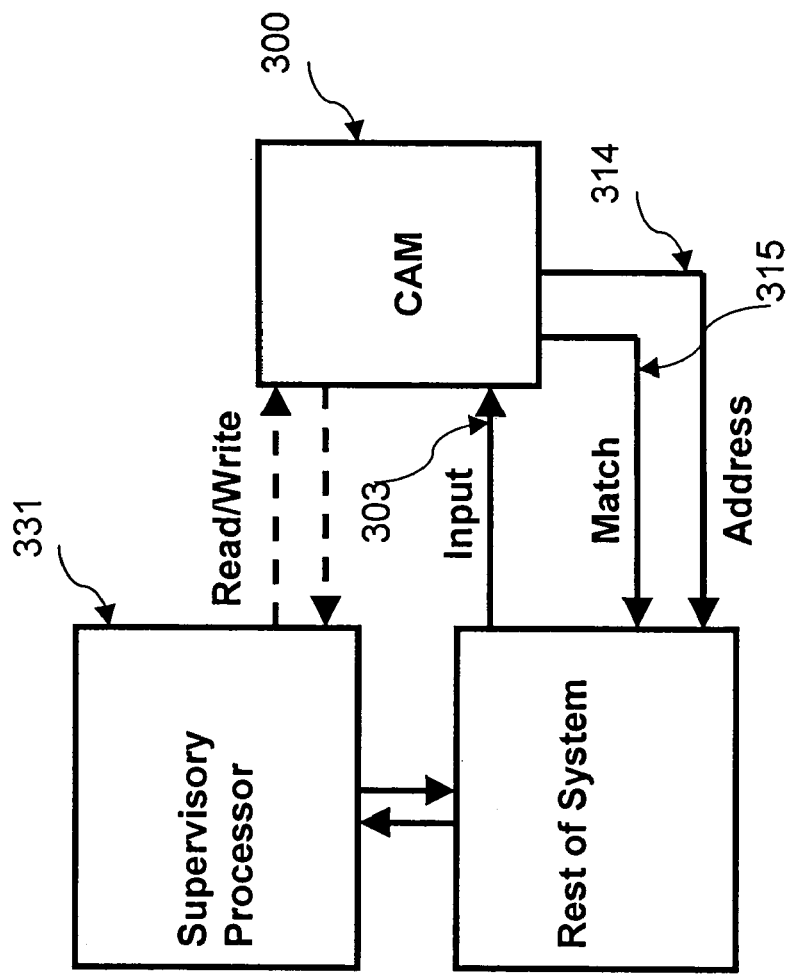
FIG. 3B is a block diagram of a system using a CAM according to one embodiment of the present invention.

The CAM 300 can be used in a system as illustrated in FIG. 3B. In one embodiment, there are two phases to the use of the CAM 300: a Control Phase during which the CAM 300 is loaded with entries, and a Data Phase during which the CAM 300 compares input values against the stored entries and returns the result. The Supervisory Processor 331 is charged with loading the configuration registers and memories of the CAM 300 with entries. Once it is loaded, the CAM 300 operates independently in the Data Phase where it accepts input 303, compares it against the entries, and returns the resulting Match indicator 315 and the Selected Address 314.

Figure 3C:
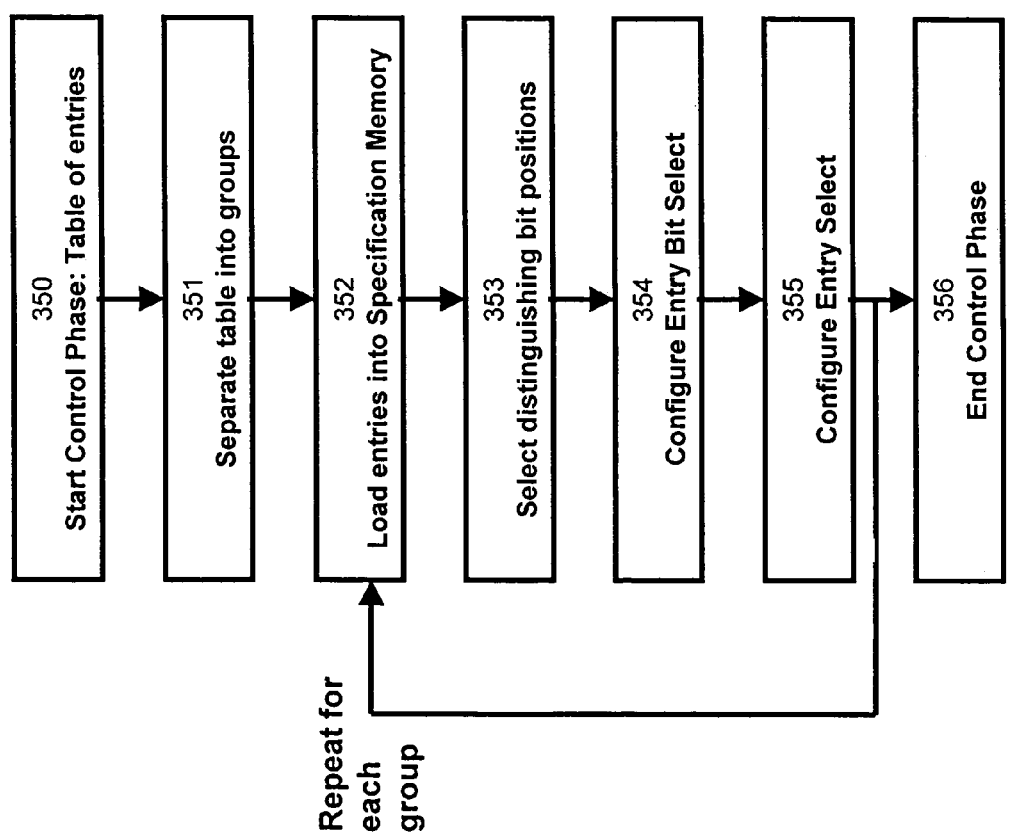
FIG. 3C is a flow chart of the Control Phase technique according to one embodiment of the present invention.

The goal in the Control Phase is to load the CAM 300 in such a way that only one entry in each Block of the CAM can possibly match any given input. One way to accomplish the goal is illustrated by the sequence of steps illustrated in FIG. 3C. The starting point 350 is a table with up to N×n entries. In the first step 351, the entries are separated into up to N groups, each with no more than n entries, in such a way that within each group no more than one entry can match any given input. The next three steps are repeated, once for each group formed in step 351. In step 352, the entries of the group are loaded into the Specification Memory 301 of a new Block in the CAM 300. In step 353, certain bits positions are selected for the group so that the values of the selected bit positions are sufficient to distinguish a single entry from the rest of the entries in that group. In the next step 354, the Entry Bit Select 302 is configured with the bit positions selected in step 353. Then in Step 355 the Entry Select 305 is configured so that it has the distinguishing bits of entries in locations corresponding to the locations of the entries in the Specification Memory 301.

Figure 3D:
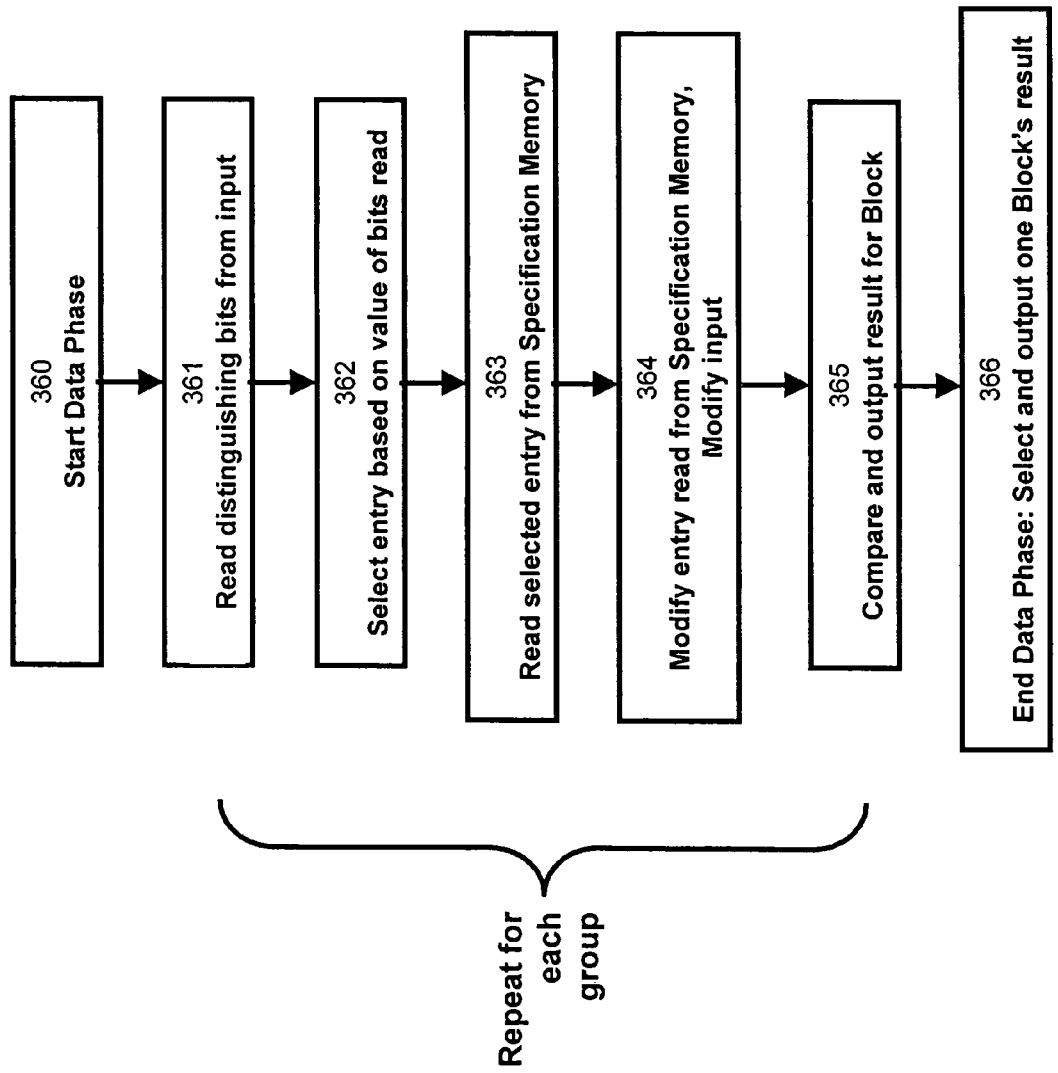
FIG. 3D is a flow chart of the Data Phase technique according to one embodiment of the present invention.

The goal of the Data Phase is accomplished by the CAM 300. Each block of the CAM 300 acts as illustrated by the flow chart of FIG. 3D. In step 361, the bit positions configured into the Entry Bit Select are read from the input 303. In step 362, the Entry Select 305 selects at most a single entry based on the bit values read in step 361. In the following step 363, the selected entry is read from the Specification Memory 301. In the optional step 364, the value from the specification memory is modified by Interpretation circuit 307, and/or the input is modified by the Compare Bit Select and Interpret Circuit 316. In step 365, the Compare circuit 309 compares the optionally modified values from step 364 against each other, and outputs the result. In step 366, the Priority Circuit 313 selects one of the results from all the blocks, and outputs the selected result.

Figure 6:
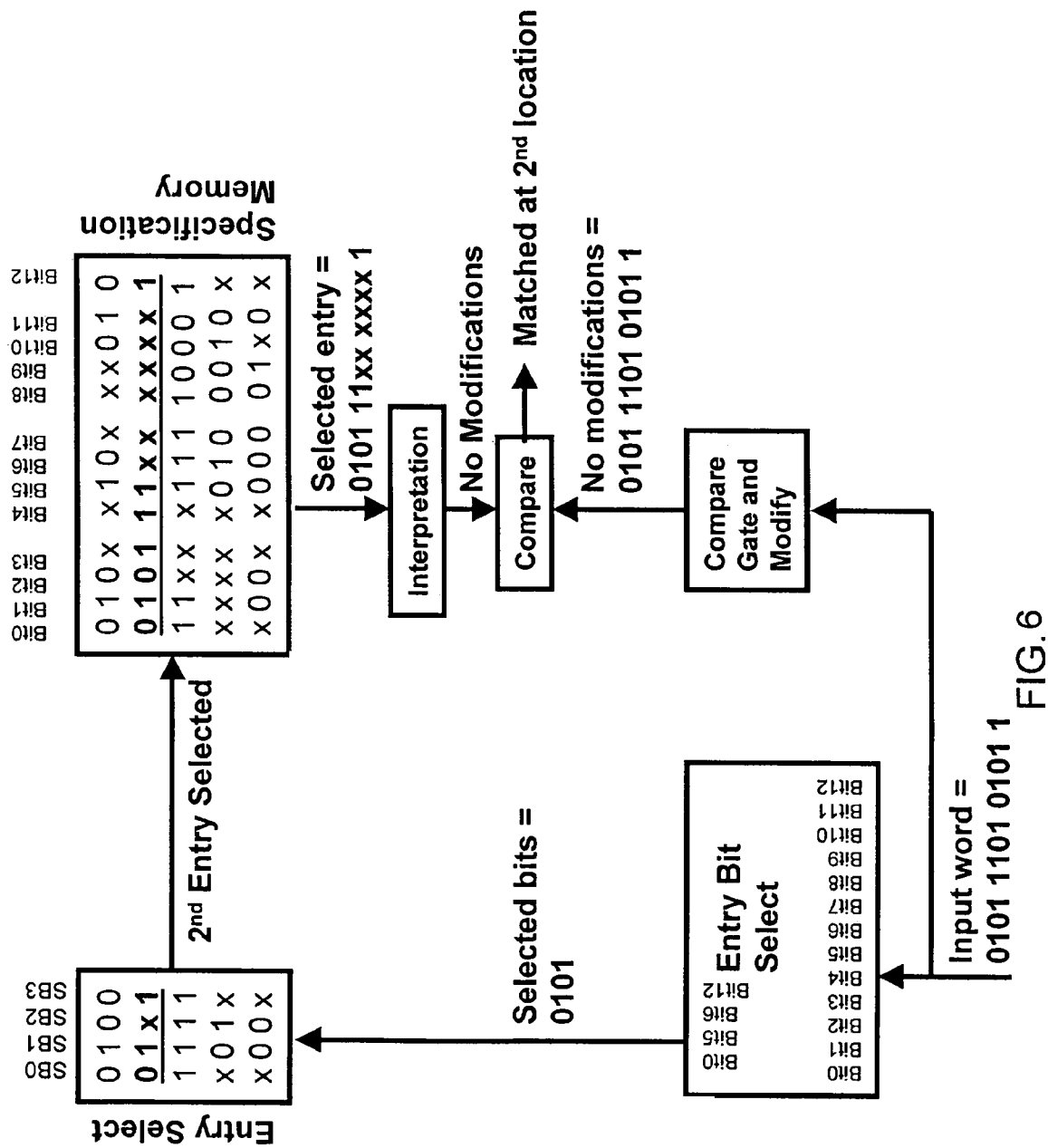
FIG. 6 shows configuration values for the first group shown in the example set forth in FIG. 5 according to one embodiment of the present invention.

The operation of the CAM 300 can be illustrated with the example table of CAM entries shown in FIG. 4. The example table has 20 entries of 13 bits each, with each bit having 3 possible states, 0, 1, and x. The table can be split into groups of five entries or less, as shown in FIG. 5, so that only one entry from the group can possibly match any given input. Within each group, a few bits are sufficient to distinguish uniquely between the entries, and these bits are shaded (highlighted). There may be more than one way to group the entries, and there may be more than one set of distinguishing bits. For the purposes of various embodiments of the present invention, the particular choice of groups or bits does not matter. The Entry Bit Select circuit 302 is configured so that the highlighted bits in each group are automatically selected as input into the Entry Select circuit 305. The potential outputs of the Entry Bit Select 302 are shown in the table of FIG. 5 as SB0, SB1, SB2, and SB3. The acceptable values of SB0-3 for a group are loaded into the Entry Select 305. The group entries are loaded into the Specification Memory 301 at the same location that the selected bits for that entry are found in the Entry Select 305. If the input value of SB0-3 matches one of the acceptable values, the corresponding entry in the specification memory is selected and is output as a potential match on lines 306. In this example, the Interpretation circuit 307 is configured to not modify the output, and the Compare Gate and Modify circuit 316 is configured to output all input bits, so the selected entry is compared directly against the input word. FIG. 6 shows the configuration and values for the first group, and the results of an example input. The Entry Bit Selector 302 selects Bits 0, 5, 6, 12 as inputs to the Entry Select Circuit 305. The selected bits match the $2^{nd}$ entry of the Entry Selector 305. The $2^{nd}$ entry of the Specification Memory 301 is read out, and compared against all bits of the input 303, resulting in a match.

Embodiments of the present invention are an improvement over conventional CAMs because the Specification Memory blocks are memory arrays composed of pure RAM cells (not conventional ternary CAM cells). The size of a RAM cell is smaller than a CAM cell. In the case of static RAM technology, the pure RAM cell can be one-third to one-fifth the size of a ternary CAM cell. The size can be reduced even further by using DRAM or 1-T SRAM technologies, so the memory cells used in embodiments of the present invention can be less than one-tenth the size of the CAM cell. Thus the size of a CAM implementation will be much smaller (⅓ to 1/10 the size) than an equivalent size of a conventional CAM. Thus, in a given size of silicon, a CAM according to the present invention can have tables that are three to ten times larger, compared to conventional CAMs. The cost per bit for the present invention can be in excess of 10 times less expensive.

In a conventional CAM, a comparator circuit is built into each cell of the array. So each input activates as many comparator circuits as there are bits in the CAM. In the embodiments of the present invention, there is only one entry-wide comparator per group, apart from the few narrower comparators used in the Entry Select circuit. Thus the power consumption for the computation of a match is also reduced by a factor approaching the size of the group.

An aspect of one embodiment of the present invention that distinguishes it from conventional CAM devices is the separation of memory elements from the computation/compare elements. This separation permits the two elements to be independently optimized for power and cost. For example, the comparators used in embodiments of the present invention can use more sophisticated power management techniques since the complexity is amortized over the large number of elements in every block. As another example, the memory blocks can utilize lower voltage swings without being constrained by the requirements of the comparators.

Since the implementation size and the power consumption are much smaller than conventional CAMs, the embodiments of the present invention are much more amenable to integration. Not only can much larger CAM tables be integrated on a single die, but also very large CAM tables can be integrated on the same die with complex logic functions such Network Processors, Traffic Managers, and Security chips. By separating the compare function from the memory in the CAM, more complex compare functions (e.g. range compare) can be implemented without significant additional cost.

In the Control Phase, there are a variety of ways to accomplish the grouping of entries. The most efficient way to group the entries will depend on the characteristics of the table of entries. For example, if the entries do not have any x (don't care) values, the task of finding entries that are eligible to belong to a group is straight-forward since all entries are by definition unique and so any given input can only match a single entry regardless of how the entries are grouped. This is the case for several tables common in networking, including what are called flow tables in networking parlance. In the typical forwarding table used in networking applications, the table entries have the form of prefix addresses and thus have x (don't care) bits that are contiguous. This case can be handled in a number of ways, for example with a strategy of grouping entries by the number of x (don't care) bits in them. In the more general classification case, it may be necessary to adopt more complex strategies. For example, the entries may be grouped deterministically using a two pass approach. During a first pass, the data is organized into a tree with three potential branches from each node. In a second pass the tree can be traversed in a variety of ways to form the groups. An idea that works well in the tree traversal is at each node that has both a 0-branch and a 1-branch to pick one entry from the 0-branch and one entry from the 1-branch. The two entries chosen in this way are guaranteed to not match simultaneously since they differ in that bit position. Another option is to use statistical information, for example regarding IP addresses, to identify the bit positions used to distinguish the data in each group. In this technique, the flow chart will differ from FIG. 3C in that the distinguishing bit positions are chosen first and then the groups are formed. In this technique, it is not required that the same set of bit positions be used for all groups in the CAM; one set may be used until distinction between remaining entries becomes difficult, and then another set can be used. A variation of this technique is to select the set of distinguishing bit positions at random. This works well when dealing with large tables with a good distribution of values within the table.

The selection of entries for a group also has a bearing on the distinguishing bit positions for that group, and hence on the number of bit positions chosen for the Entry Selector 305. Though the Entry Selector can be designed to handle any number of bit positions, the logic can be simplified if the Control Phase chooses a minimal number of distinguishing bit positions for each group. The smallest number of distinguishing bit positions is $log_2$ of the number of entries in the group, and the largest necessary is one less than the number of entries in the group. The tree traversal technique, as well as the technique of choosing the bit positions (at random or with a priori statistical knowledge) before choosing the groups, can help select minimal numbers of distinguishing bit positions.

Another consideration in the grouping of entries and selection of bit positions is whether x (don't care) values are permitted in the distinguishing bit positions for any group. Implementation of the Entry Select circuit can be simplified by not permitting x (don't care) values in the distinguishing positions. In this case, the Control Phase task is to group entries in such a way that distinctions between entries in each group can be made by considering only those bit positions where there are no x (don't care) values within that group. An example of this strategy is shown in FIG. 8, where the entries of the table of FIG. 4 have been grouped so that x (don't care) values are not needed in the Entry Select.

Figure 7:
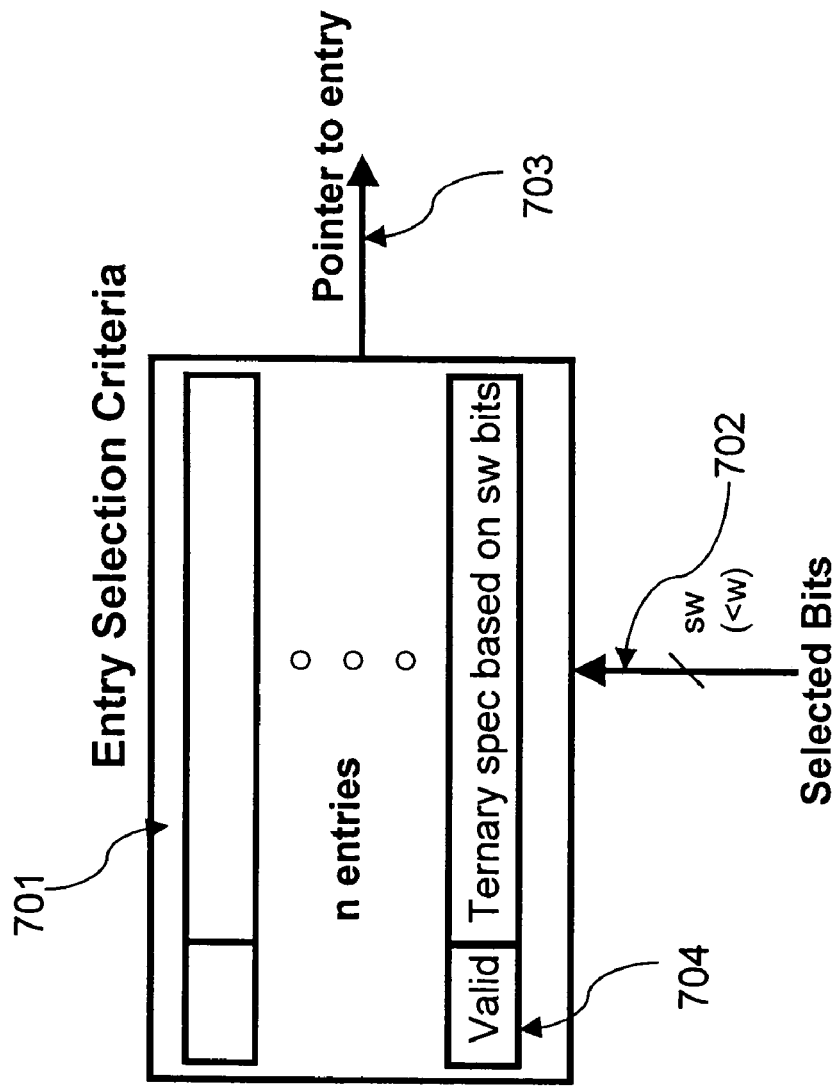
FIG. 7 shows an Entry Select Circuit based on ternary CAM bits according to one embodiment of the present invention.

An implementation of the Entry Select circuit 305 based on CAM bits is shown in FIG. 7. It uses a conventional CAM 701, of width sufficient to hold the selected bits. The depth of the table is equal to the number of entries in a group. The selected bits 702 choose at most one of the entries, and the CAM will return a pointer 703 to the selected-bit-based entry specification that matched. Since not all entries in a group may be defined (as in Group 4 of FIG. 5) a valid bit 704 is appended to each selection criterion. The valid bit can be set to invalid when there is no entry at that location. The CAM cells used in this implementation will need to be ternary if x (don't care) values are permitted in the distinguishing bits as in FIG. 5, but can be binary if x (don't care) values are not permitted as in FIG. 8.

Figure 13:
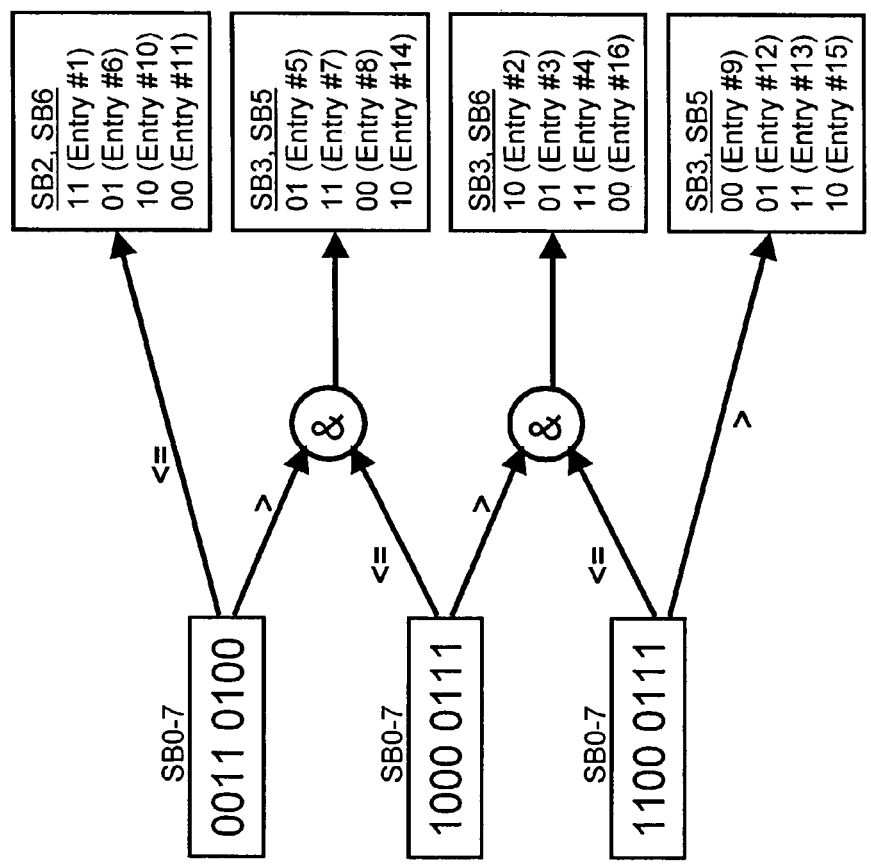
FIG. 13 shows the logical operation of a 2-stage Entry Selector according to one embodiment of the present invention.
Figure 14:
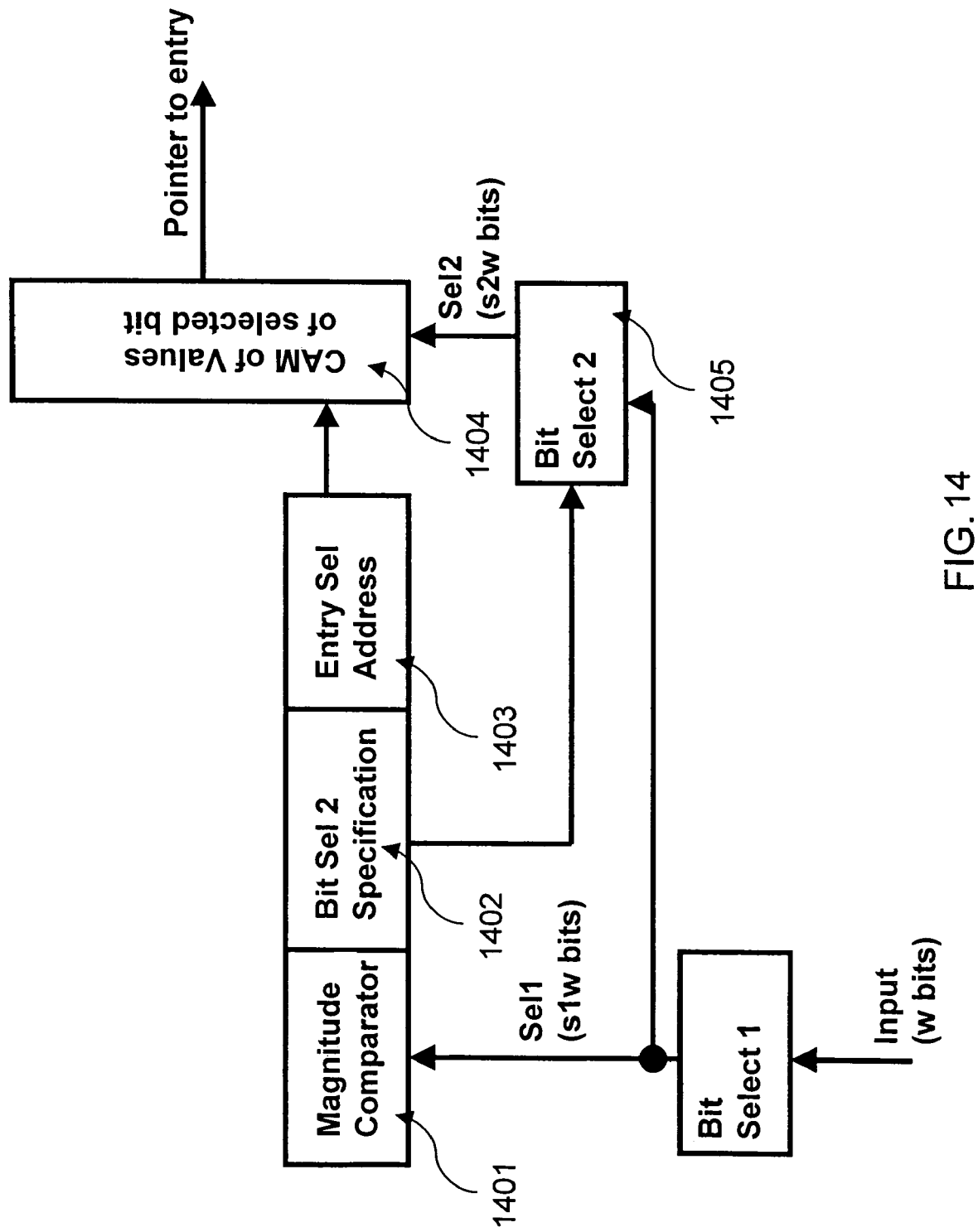
FIG. 14 is an example of 2-stage Entry Selector implementation according to one embodiment of the present invention.

The size of the Entry Select circuit 305 can be reduced further by using a multi-stage technique. FIG. 11 shows an example of Entry Select information where 8 selected bits are used to select among 16 entries. In FIG. 12 the information has been split into four segments according to the magnitude of the number formed by the bits. A few of the bits, shaded in gray, are used to distinguish between entries. Entry selection is done in two stages. In the first stage, all the selected bits SB0-7 are used to decide which segment applies, and in the second stage some of the SB0-7 bits are used to select an entry within the segment. FIG. 13 shows the logical operation of a 2-stage Entry Select 305. FIG. 14 shows an example implementation. The selected bits SelI are used by a Magnitude Comparator array 1401 to select one row of memory containing information on discriminating bits for stage 2 (1402) and an address offset 1403 into a CAM 1404 of second-stage bit values. The information of the bits needed for the second stage is directed to the second Bit Select circuit 1405, which picks out the appropriate bits to provide as input to the CAM. Single-stage selection would have required a 16×8 CAM for the example table of FIG. 11. The 2-stage selector implementation of FIG. 12 requires three 8-bit magnitude-comparators, and a 16×3 CAM. In some cases the CAM can be replaced by a decoder. Multi-stage circuits will reduce the implementation cost, particularly when the group size is large and there are many bits in the entry selector, trading off latency for transistor efficiency.

In the case where the Control Phase can ensure that the number of bits selected is exactly equal to $\log_2$ of the group size, the Entry Select circuit can be simplified to a simple decoder.

Figure 15:
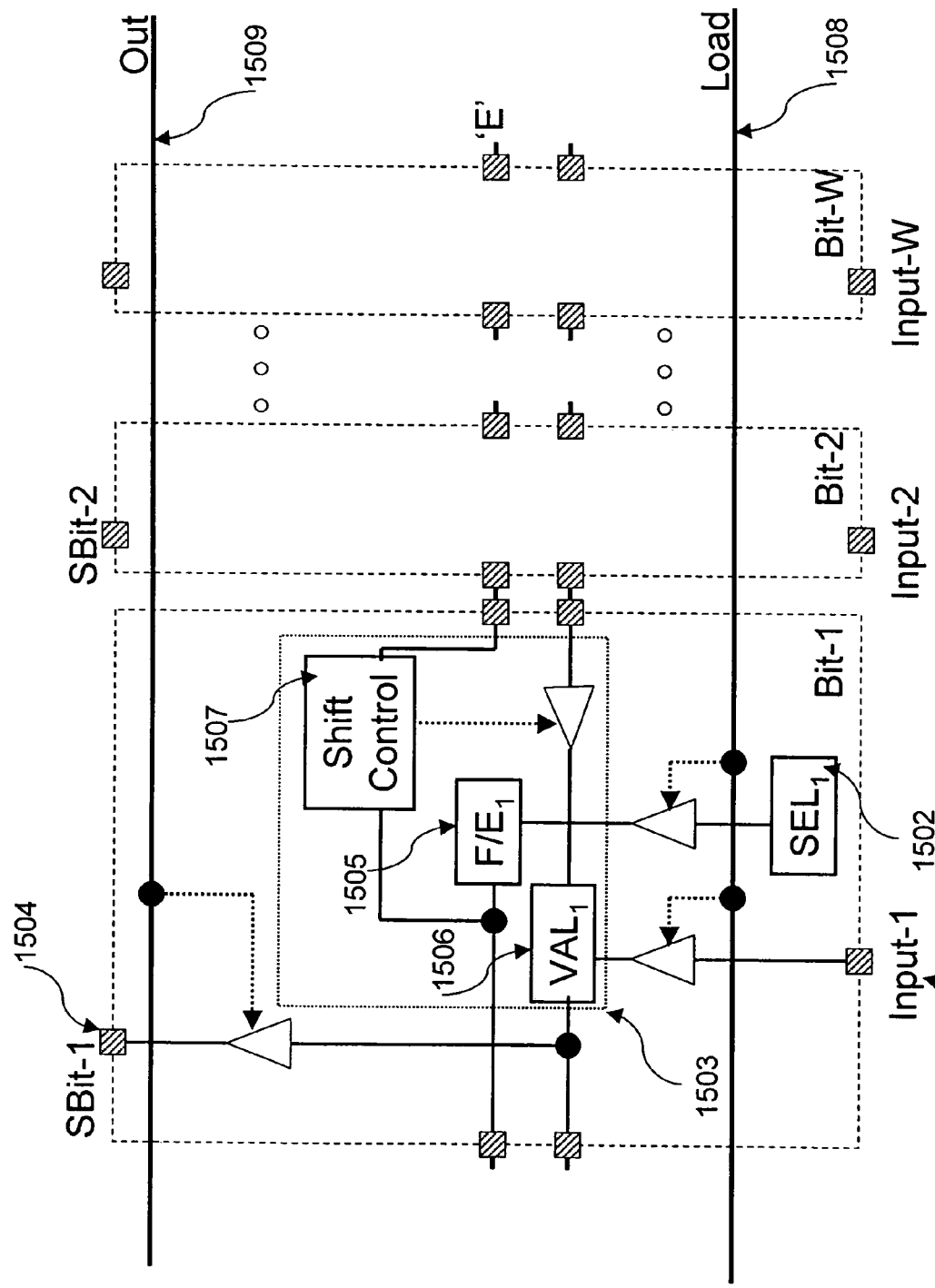
FIG. 15 shows a Bit Selector circuit according to one embodiment of the present invention.

FIG. 15 shows an example implementation of the Bit Select circuit. The bits in the input 1501 to be selected are indicated by a '1' value in the selection register SEL 1502. When a load is signaled, selected bits are loaded into the shift register 1503. In this example, there are two bits in each shift register cell, F/E 1505 indicating whether the shift register bit is full or empty, and VAL 1506 indicating the value if it is full. Thus, when a bit is loaded, the corresponding F/E bit is set to 'full'. All other F/E bits are set to 'empty'. When the load is completed, the shift register is activated for shifting. Shifting is accomplished in a series of steps. In each step, the shift register moves values from a 'full' location to the adjacent location on the left, if it is 'empty'. On completing such a move, the original location is set to 'empty' and the new location is set to 'full'. Shifting continues until no more shifts are possible. The Shift Control circuit 1507 uses the value of the F/E bit from the current location and the previous location to make the decision on whether a move is permitted, and is responsible for setting and resetting the F/E bit at both the current and the previous location. The sequence of steps for an example bit selection is shown in FIG. 16. By the final step (Step 5), all the selected bits are positioned at the leftmost bits, and the bits are directed to the output lines SBit 1504 by the Out signal. If the shift register is asynchronous, all the steps may be completed in one cycle of the CAM.

Figure 17A:
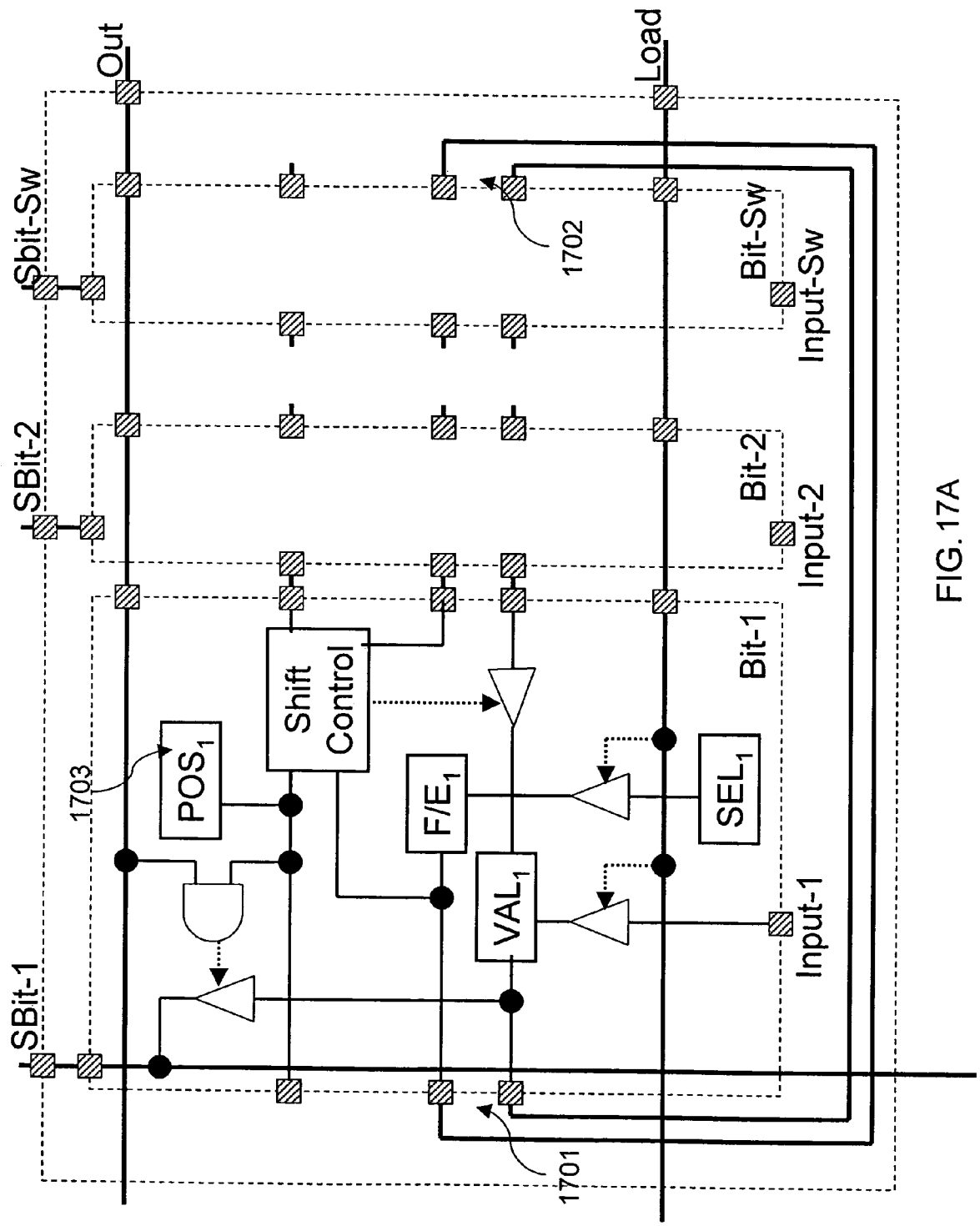
FIG. 17A shows an overlapped bit select circuit according to one embodiment of the present invention.
Figure 17B:
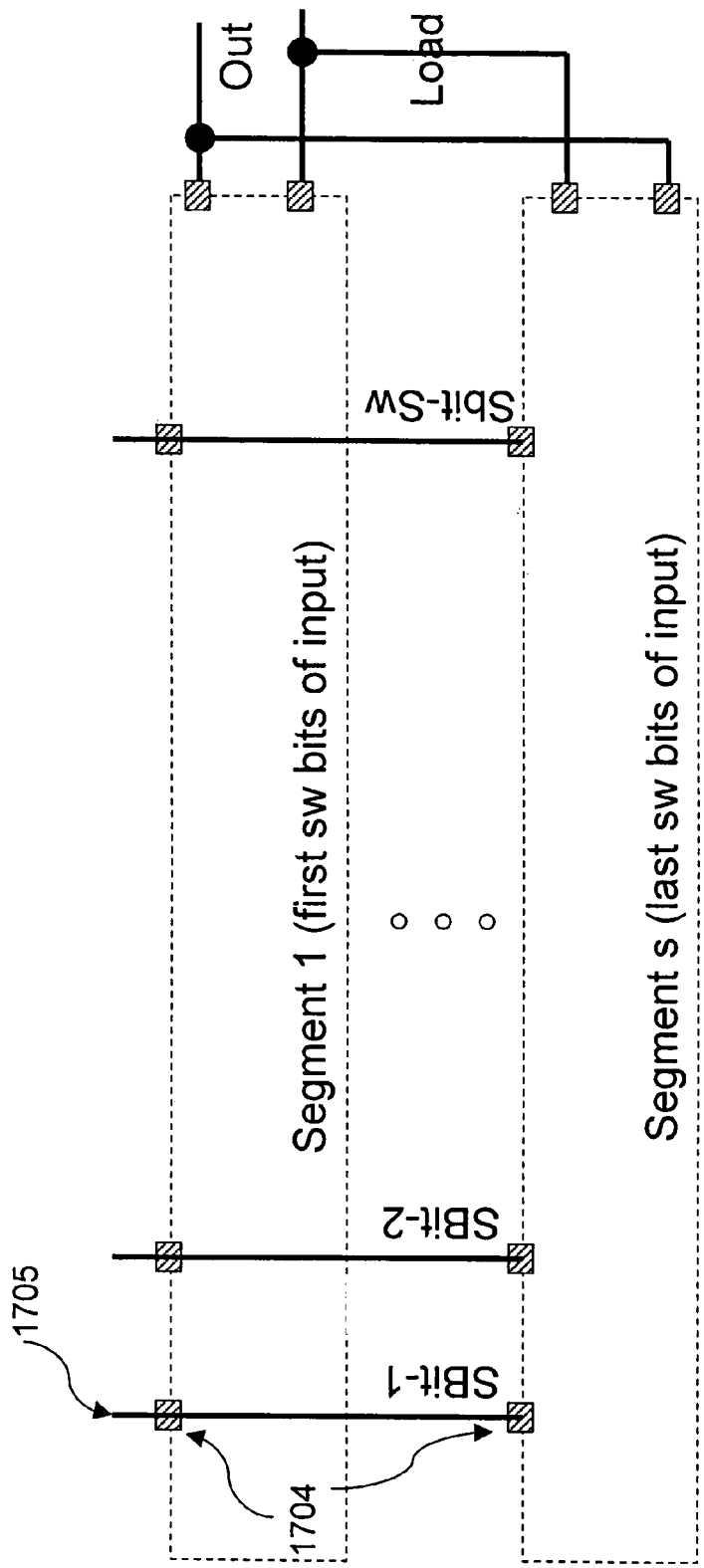
FIG. 17B shows how segments of the overlapped bit select circuit are connected according to one embodiment of the present invention.

The worst case number of steps required to shift the relevant bits to the most significant bits can be reduced by using the scheme of FIG. 17. The shift register length is divided into two or more segments, each of length sw bits, as shown in FIG. 17B. The output 1701 of the left-most bit of each shift register is connected to the input 1702 of right-most bit to form a circular shift register. An additional bit POS 1703 is used to indicate the final position of the shifted bits in each segment. During the shift process, no shifts are permitted from a bit with POS=1 to a bit with POS=0. The shift control for any location considers the POS value, as well as the F/E value, of the current location and the previous location. The segments are overlapped so that the output from the first bit of each segment 1704 is connected to the first bit of the bit selector output S-Bit1 1705. Similarly, $2^{nd}$ bit outputs from all segments is connected to SBit-2, and so on. The POS bits are configured so that the POS bit for only one segment is set to 1 for any given SBit location; and so that in any given segment all POS bits are contiguous. Once the shift registers of the segments are loaded from the inputs, the circular shift begins, and by the last step all selected bits will be positioned so that they are properly aligned from the leftmost SBit. Since circular shift registers are used, the order of the selected bits may be different from the original input. FIG. 18 shows the sequence of steps. When the shifting is complete, as shown in step 2, the two circular registers have their full bits aligned so that there is no overlap, and the values can be loaded onto to the output lines. The value is output only if the POS bit is set for that location. By overlapping, the time to complete the bit selection procedure is reduced, in this example, from 5 steps to 2 steps. When the length of the segment is shorter than the number of selected bits, additional configuration bits are required to direct the shifted values in each segment to the appropriate output line.

In a conventional CAM, the interpretation of the values of the memory cells in the CAM is constrained by the logic in the CAM cell. Thus in a typical ternary CAM cell, one memory cell is always interpreted as a mask, indicating whether the value is x (don't care) or not, and the other memory cell is interpreted as the non-x value. Embodiments of the present invention separate the interpretation function from the memory in the CAM, thus allowing many options for what kind of values are stored in the Specification Memory 301. These options include, but are not limited to, binary, ternary, range specifications, and compressed specifications. In the case of binary specification, w bits of memory can be used for a w-bit sized input. In the case of ternary specification, 2w bits of memory can be used for a w-bit sized input. For range specification, it is possible to define two fields as defining the start and end of a range, or a start and a count is another way of defining a range. It is also possible to define range fields that have the form greater than, or less than, etc.

Figure 10:
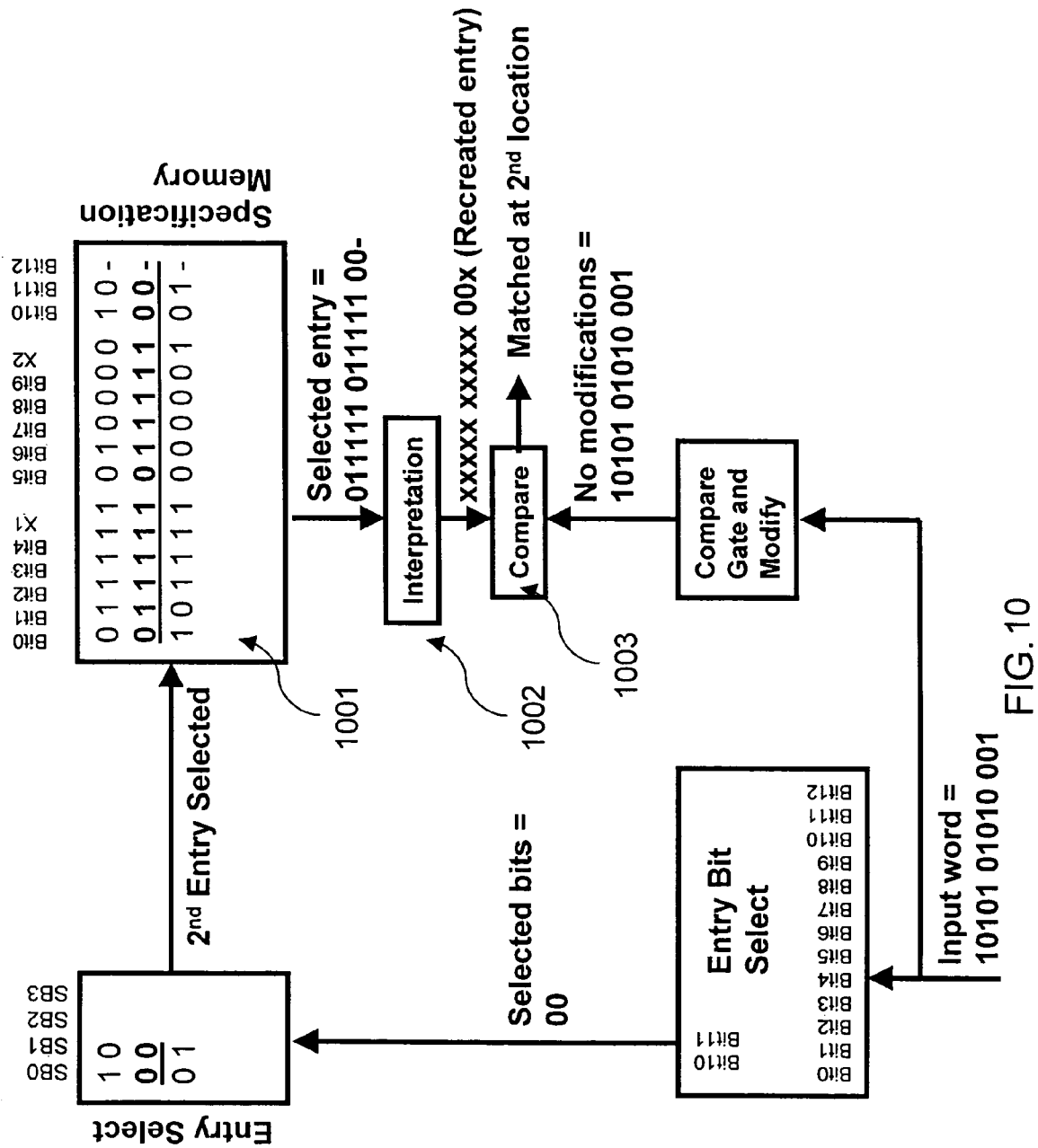
FIG. 10 shows a compressed specification for the third group of FIG. 8 according to one embodiment of the present invention.

Many representations of compressed fields are possible. As an example, subnet address fields (also called prefix addresses) of width w bits requires 2w memory cells in standard ternary CAMs, but by using the coding scheme shown in FIG. 9, it is possible to represent prefix addresses of w bits with just w+1 bits in embodiments of the present invention. The additional bit is appended to the end of the w bits, and is used to indicate if the previous bit should be compared or not. If the bit is not to be compared, then the value of the bit indicates whether the next bit is to be compared. This process continues until a bit indicates that the next bit is to be compared. After that point all bits are compared. It is also possible to reduce memory requirements by group entries in such a way that the specification of mask bits (specifying which bits to compare) is common to the whole group. Both these techniques are used in FIG. 10, which uses the third group of FIG. 8 as an example. The Specification Memory 1001 has no x values, but has two new bits X1, and X2, which are associated with prefixes Bits 0–4, and Bits 5–9. The Interpretation circuit 1002 is designed to recognize these fields as prefix values. In addition, since Bit 12 is 'x' for the entire group, the Interpretation circuit is configured to treat Bit 12 as x (don't care). The Specification Memory can have arbitrary values in Bit 12. The Interpretation circuit recreates the original entry from the coded form, and the recreated entry is compared against the inputs by the Compare circuit 1003.

With respect to the Interpretation techniques, of the present invention, there are a number of options available as potential embodiments of the present invention. The interpretation options are complementary to the coding options in the Specification Memory. In addition to the options already mentioned above, it is possible to include run-time error checking and error correction in this circuit. This is a function that is very hard to provide in the typical ternary CAM. It is also possible to vary the interpretation of the entries from entry to entry in the same group if additional code bits are provided in the Specification Memory to indicate how the entry is to be interpreted. This may be useful where the "meaning" of certain bits in the input changes with the value of certain other bits.

Various Compare Options (or other operations) are available for the implementation of comparisons by circuit 309, including, but not limited to, bit-for-bit compare, range compare, and various "soft" comparisons. Bit-for-bit compare is the standard CAM approach. Range compare is possible to implement cheaply since, the range computation is done once for the group. Special forms of compare can allow tolerances in values, or permit computation of vector distances. This may useful in "soft" comparisons, such as voice prints, and images. In general, the combination of options in the how bits are interpreted and the options in the compare block allow complex ALU-like functionality in embodiments of the present invention. Since the logic used in performing these more complex operations is duplicated for every group, not every memory cell, the present invention supports more complex logic at a modest cost.

The examples shown so far use the entire input word in the Compare Circuit, so the Compare Gate and Modify circuit is optional. However, in certain embodiments of the present invention, this circuit can provide for additional useful functionality. For instance, it is possible to steer fewer bits than the input into the Compare Circuit when, for instance, bits used in the Entry Select Circuit need not be compared again. This will reduce the number of memory bits in the Specification Memory. It is also possible in this circuit to check whether certain conditions are met by the input before allowing any operation to proceed in the Block. This is particularly useful if during the Control Phase, all entries in a group are chosen so that all entries in that group meet certain criteria. These criteria then can become gating criteria enforced by the Compare Gate and Modify circuit. In this case, not all blocks of the CAM 300 will be activated during every compare, saving even more power consumption.

As will be understood by those familiar with the art, the invention may be embodied in other specific forms without departing from the spirit or essential characteristics thereof. Likewise, the particular naming and division of the modules, managers, features, attributes, methodologies and other aspects are not mandatory or significant, and the mechanisms that implement the invention or its features may have different names, divisions and/or formats. Furthermore, as will be apparent to one of ordinary skill in the relevant art, the modules, managers, features, attributes, methodologies and other aspects of the invention can be implemented as software, hardware, firmware or any combination of the three. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

What is claimed is:

1. A method for implementing content-addressable memories, comprising the steps of:
    a) separating entries of a content-addressable memory into different groups, wherein no more than one entry of any group can match any given input and wherein one of said different groups is grouped in such a way that the specification of which bits to compare is common to the whole group;
    b) selecting a number of bit positions for each said group as distinguishing bit positions, wherein, the values of the entries in the selected distinguishing bit positions are sufficient to uniquely identify entries within each said group, and wherein the values of the entries at the selected distinguishing bit positions are not x (don't care) values within each said group;
    c) configuring a bit selector circuit with the selected distinguishing bit positions,
    d) configuring an entry selector circuit with values from the entries at the distinguishing bit positions, wherein, the entry select circuit is a binary content-addressable memory, and
        wherein, the entry selector circuit further comprises a multi-stage circuit to perform a matching function;
    e) loading the entries into a specification memory at locations corresponding to the distinguishing bit position in the entry selector circuit;
    f) selecting bits from the given input at locations that configured into the entry bit selector circuit
    g) matching the value of the selected given input bits to at most one of the values configured into the entry select circuit;
    h) reading an entry from the specification memory at the location corresponding to the matching location in the entry select circuit;
    i) modifying the entry read from the specification memory;
    j) comparing the modified entry against an input word; and
    k) outputting results of the comparison.

* * * * *